United States Patent
Hosoya et al.

(10) Patent No.: US 8,569,178 B2
(45) Date of Patent: Oct. 29, 2013

(54) PLASMA PROCESSING METHOD AND PLASMA PROCESSING APPARATUS

(75) Inventors: Masanori Hosoya, Shanghai (CN); Masahiro Ito, Nirasaki (JP); Ryoichi Yoshida, Nirasaki (JP)

(73) Assignee: Tokyo Electron Limited (JP)

( * ) Notice: Subject to any disclaimer, the term of this patent is extended or adjusted under 35 U.S.C. 154(b) by 27 days.

(21) Appl. No.: 13/195,925

(22) Filed: Aug. 2, 2011

(65) Prior Publication Data

US 2012/0031875 A1    Feb. 9, 2012

Related U.S. Application Data

(60) Provisional application No. 61/374,055, filed on Aug. 16, 2010.

(30) Foreign Application Priority Data

Aug. 3, 2010   (JP) .................................. 2010-174149

(51) Int. Cl.
   *H01L 21/302*   (2006.01)
(52) U.S. Cl.
   USPC ............. 438/717; 216/41; 438/706; 438/710; 438/737
(58) Field of Classification Search
   USPC ......... 216/41; 438/706, 710, 737; 156/345.26
   See application file for complete search history.

(56) References Cited

U.S. PATENT DOCUMENTS

| | | | | |
|---|---|---|---|---|
| 8,133,819 | B2* | 3/2012 | Wang et al. | 438/725 |
| 8,138,096 | B2* | 3/2012 | Yoshida | 438/714 |
| 2003/0232504 | A1* | 12/2003 | Eppler et al. | 438/709 |
| 2006/0105574 | A1* | 5/2006 | Regini et al. | 438/706 |
| 2009/0087996 | A1* | 4/2009 | Chi et al. | 438/710 |
| 2009/0105574 | A1* | 4/2009 | Young | 600/372 |

FOREIGN PATENT DOCUMENTS

| | | |
|---|---|---|
| JP | 2004-163451 | 6/2004 |
| JP | 2007-180358 | 7/2007 |

* cited by examiner

*Primary Examiner* — Lan Vinh
*Assistant Examiner* — Maki Angadi
(74) *Attorney, Agent, or Firm* — Cantor Colburn LLP

(57) ABSTRACT

A plasma processing method includes: etching an anti reflection coating film with plasma generated from an etching gas by using a resist film that is patterned as a mask, in a deposited film in which an Si-ARC film constituting the anti reflection coating film is formed on a layer to be etched and the ArF resist film is formed on the anti reflection coating film; and modifying the ArF resist film with plasma generated from a modifying gas including a $CF_4$ gas, a COS gas and an Ar gas by introducing the modifying gas into a plasma processing apparatus, wherein the modifying is performed before the etching.

9 Claims, 19 Drawing Sheets

<SiN ETCHING>

<ORGANIC FILM ASHING>

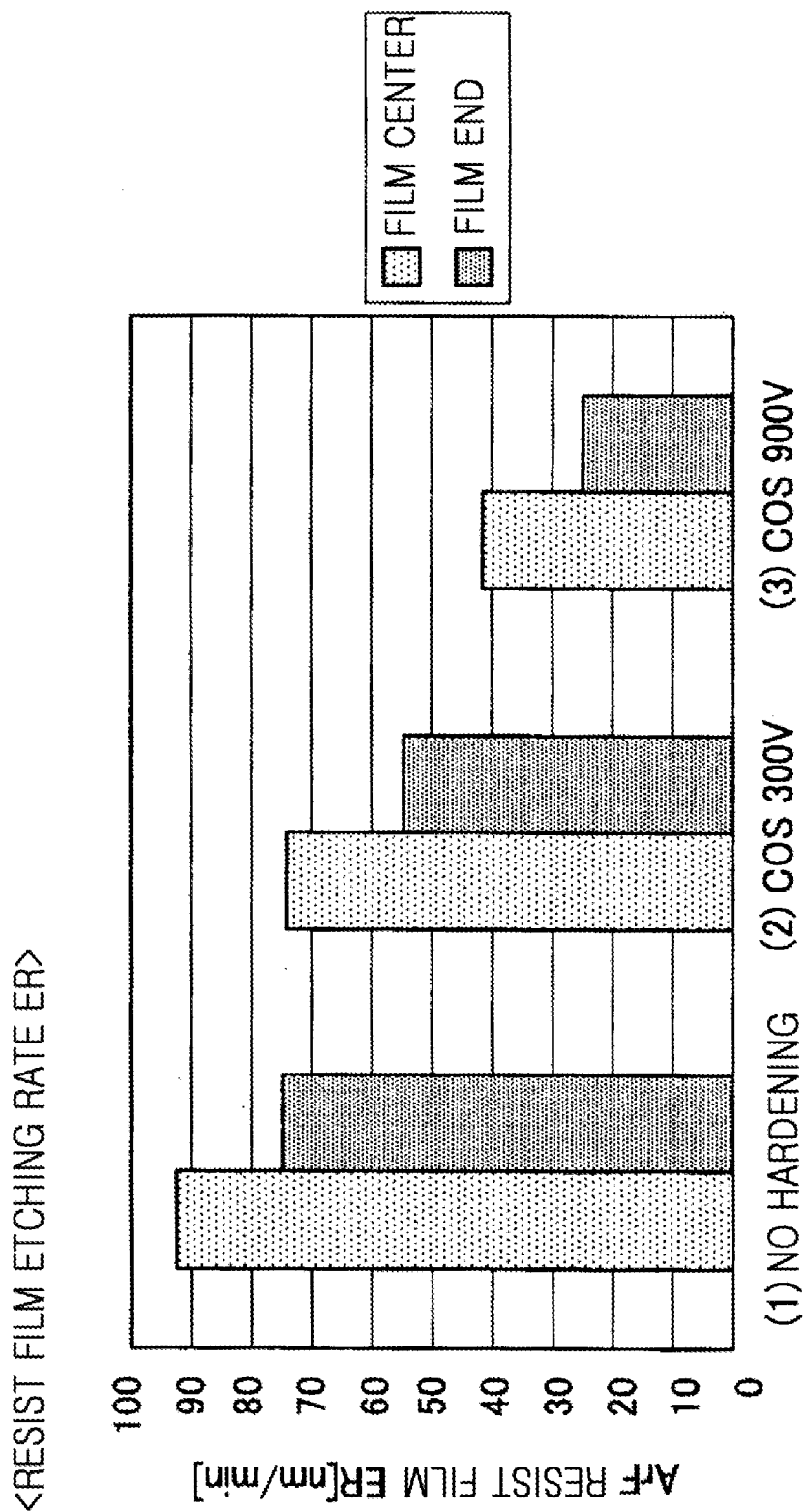

| CD [nm] | Initial | $H_2$=100 | COS=20 |
|---|---|---|---|
| | 49.85 | 53.72 | 51.72 |

<SiN ETCHING>

<ORGANIC FILM ASHING>

FIG. 10

| HARDENING OF RESIST FILM | BEFORE ETCHING (BEFORE HARDENING) | NO HARDENING | HARDENING PERFORMED (CF$_4$/H$_2$/Ar) | HARDENING PERFORMED (CF$_4$/COS/Ar) |
|---|---|---|---|---|
| DEPOSITED FILM (SIDE SURFACE) | | | | |
| DEPOSITED FILM (TOP SURFACE) | | | | |
| CD (nm) | CD=28.9 | CD=19.6 | CD=25.4 | CD=30.7 |
| LWR (nm) | LWR=6.6 | LWR=5.8 | LWR=4.0 | LWR=3.9 |

PLASMA PROCESSING METHOD AND PLASMA PROCESSING APPARATUS

CROSS-REFERENCE TO RELATED PATENT APPLICATIONS

This application claims the benefit of Japanese Patent Application No. 2010-174149, filed on Aug. 3, 2010 in the Japan Patent Office, the disclosure of which is incorporated herein in its entirety by reference.

BACKGROUND OF THE INVENTION

1. Field of the Invention

The present invention relates to a plasma processing method and a plasma processing apparatus for plasma processing a layer to be etched by using a resist film.

2. Description of the Related Art

In a mask process for forming a desired pattern during a semiconductor manufacturing process, patterning is performed on a layer to be etched via exposure and development after coating a photosensitive film on the layer to be etched. Here, in order to prevent reflection during the exposure, an anti reflection coating film (hereinafter, also referred to as an ARC film) is formed between the layer to be etched and the photosensitive film. For example, Patent Reference 1 discloses an etching method having a high etching rate and capable of etching with high etching selectivity when etching an ArF resist film to a desired pattern while suppressing reflection by using an anti reflection coating film on a layer to be etched (an organic film, a silicon oxynitride film (hereinafter, referred to as an SiON film)).

However, during an etching process using an ArF resist film as a mask, since plasma resistance of the ArF resist film is low, a reduction amount of the resist film is high, and thus a residual film of the resist film is low. Also, a line width of a pattern is not uniform, and thus line width roughness (hereinafter, referred to as LWR) deteriorates as the pattern is deformed.

Accordingly, Patent Reference 2 discloses a method of increasing etch resistance of a resist film by plasmatizing a gas including an $H_2$ gas and performing plasma process (hardening process) of the resist film to inject $H^+$ ions into the resist film, before a process of etching an anti reflection coating film by using an ArF resist film as a mask.

However, when an $H_2$ gas is used during a hardening step, residues are generated as silicon is deposited in an open area (a large hole or the like) inside a processing container, thereby adversely affecting an etching process afterward.

3. Prior Art Reference (Patent Reference 1) Japanese Patent Laid-Open Publication No. 2007-180358

(Patent Reference 2) Japanese Patent Laid-Open Publication No. 2004-163451

SUMMARY OF THE INVENTION

To solve the above and/or other problems, the present invention provides a plasma processing method and a plasma processing apparatus for performing a process of favorably modifying a resist film before an etching process of an anti reflection coating film using a resist film as a mask.

According to an aspect of the present invention, there is provided a plasma processing method including: etching an anti reflection coating film with plasma generated from an etching gas by using a resist film that is patterned as a mask, in a deposited film in which the anti reflection coating film is formed on a layer to be etched and the resist film is formed on the anti reflection coating film; and modifying the resist film with plasma generated from a modifying gas including a $CF_4$ gas, a COS gas and an inert gas by introducing the modifying gas into a plasma processing apparatus, wherein the modifying is performed before the etching.

According to the plasma processing method, the resist film is modified with the plasma generated from the modifying gas including the $CF_4$ gas, the COS gas and the inert gas, before etching the anti reflection coating film by using the resist film as the mask. Based on experiments and studies of the inventors, it was determined that a reduction amount of the resist film may be lowered by plasma process (hardening process) of the resist film by plasmatizing the modifying gas using the COS gas as a base, rather than by modifying the resist film by using a modifying gas using an $H_2$ gas as a base. Thus, according to the present invention, a precise pattern may be formed on the layer to be etched by etching the anti reflection coating film by using the resist film as the mask while a reduction amount of the resist film is lowered.

The etching may include applying high frequency power to a first electrode provided inside the plasma processing apparatus so as to generate the plasma from the etching gas, and the modifying may include applying a negative direct current voltage to a second electrode provided inside the plasma processing apparatus while applying the high frequency power to the first electrode provided inside the plasma processing apparatus so as to generate the plasma from the modifying gas.

The plasma processing apparatus may include: a processing container; a lower electrode as the first electrode which is provided inside the processing container and operates as a holding stage of a substrate on which the deposited film is deposited; and an upper electrode as the second electrode which is provided inside the processing container and disposed to face the lower electrode.

A ratio ($CF_4$/COS) of flow rates of the $CF_4$ gas and the COS gas included in the modifying gas may be $4/3 \leq (CF_4/COS) \leq 4$.

The ratio ($CF_4$/COS) of the flow rates of the $CF_4$ gas and the COS gas included in the modifying gas may be $2 \leq (CF_4/COS) \leq 3$.

The resist film may be any one of a resist film for ArF exposure and a resist film for EUV exposure.

A value of the negative direct current voltage applied to the upper electrode may be smaller than 0 V and equal to or above −900 V.

The inert gas included in the modifying gas may be an argon gas.

The anti reflection coating film may include silicon.

According to another aspect of the present invention, there is provided a plasma processing apparatus for etching a deposited film in which an anti reflection coating film is formed on a layer to be etched and a resist film that is patterned is formed on the anti reflection coating film, the plasma processing apparatus including: a processing container; a lower electrode which is provided inside the processing container and operates as a holding stage of a substrate on which the deposited film is deposited; an upper electrode which is provided inside the processing container and disposed to face the lower electrode; a high frequency power source which applies high frequency power to the lower electrode; a variable direct current power source which applies a negative direct current voltage to the upper electrode; and a gas supply source which introduces a modifying gas including a $CF_4$ gas, a COS gas and an inert gas into the processing container, before etching the anti reflection coating film by using the resist film as a mask, wherein plasma is generated from the modifying gas by the high frequency power, and the resist film is modified by the negative direct current voltage and the generated plasma.

BRIEF DESCRIPTION OF THE DRAWINGS

The above and other features and advantages of the present invention will become more apparent by describing in detail exemplary embodiments thereof with reference to the attached drawings in which:

FIGS. 4A and 4B are a graph and a table for explaining a state of a resist film upon performing the hardening process and applying a direct current voltage in the first embodiment;

FIG. 10 is a view for explaining an effect of the hardening process of the second embodiment.

DETAILED DESCRIPTION OF THE INVENTION

Embodiments for Carrying Out the Invention

Figure 1:
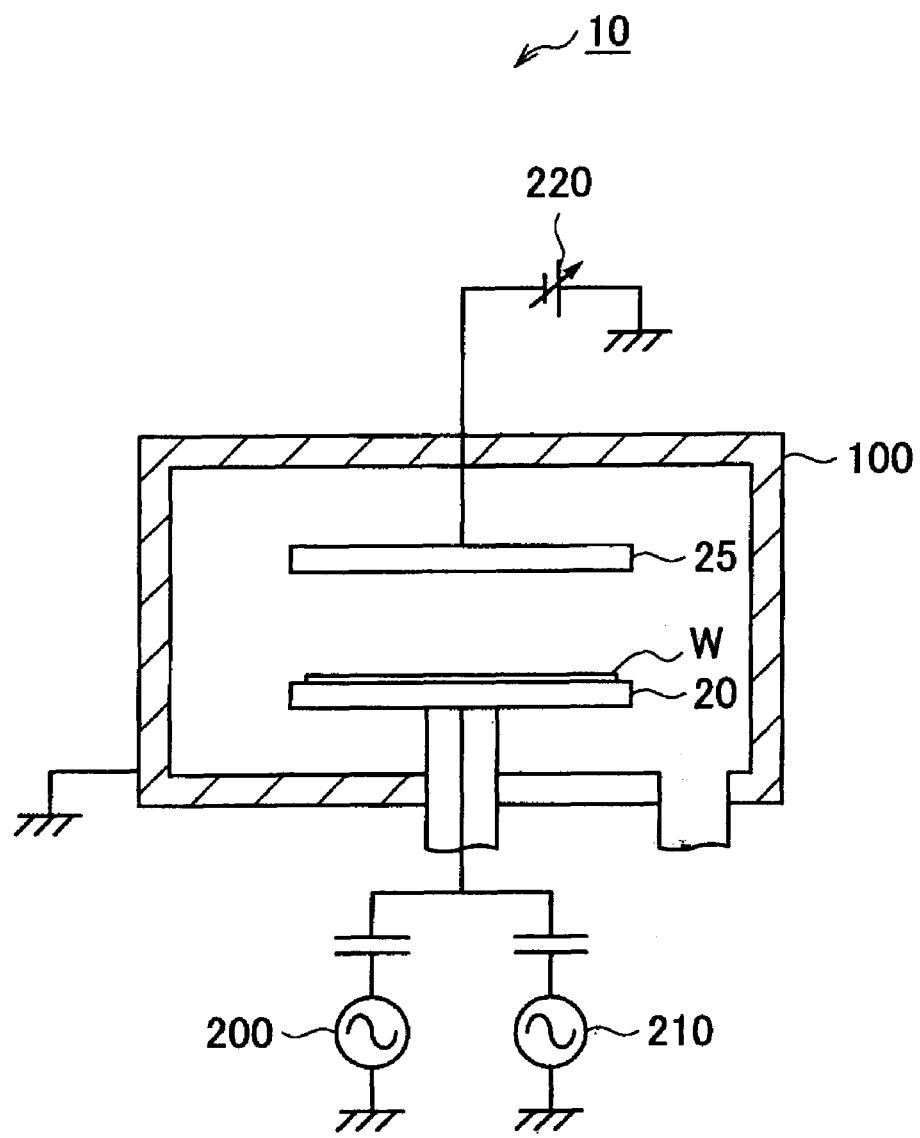
FIG. 1 is a schematic cross-sectional view of a plasma processing apparatus according to first and second embodiments of the present invention.

Embodiments of the present invention will now be explained in detail with reference to the attached drawings. Also, in the specification and the drawings, elements having substantially the same functions and configurations are denoted by the same reference numerals and thus a repeated explanation thereof will not be given.

Figure 2:
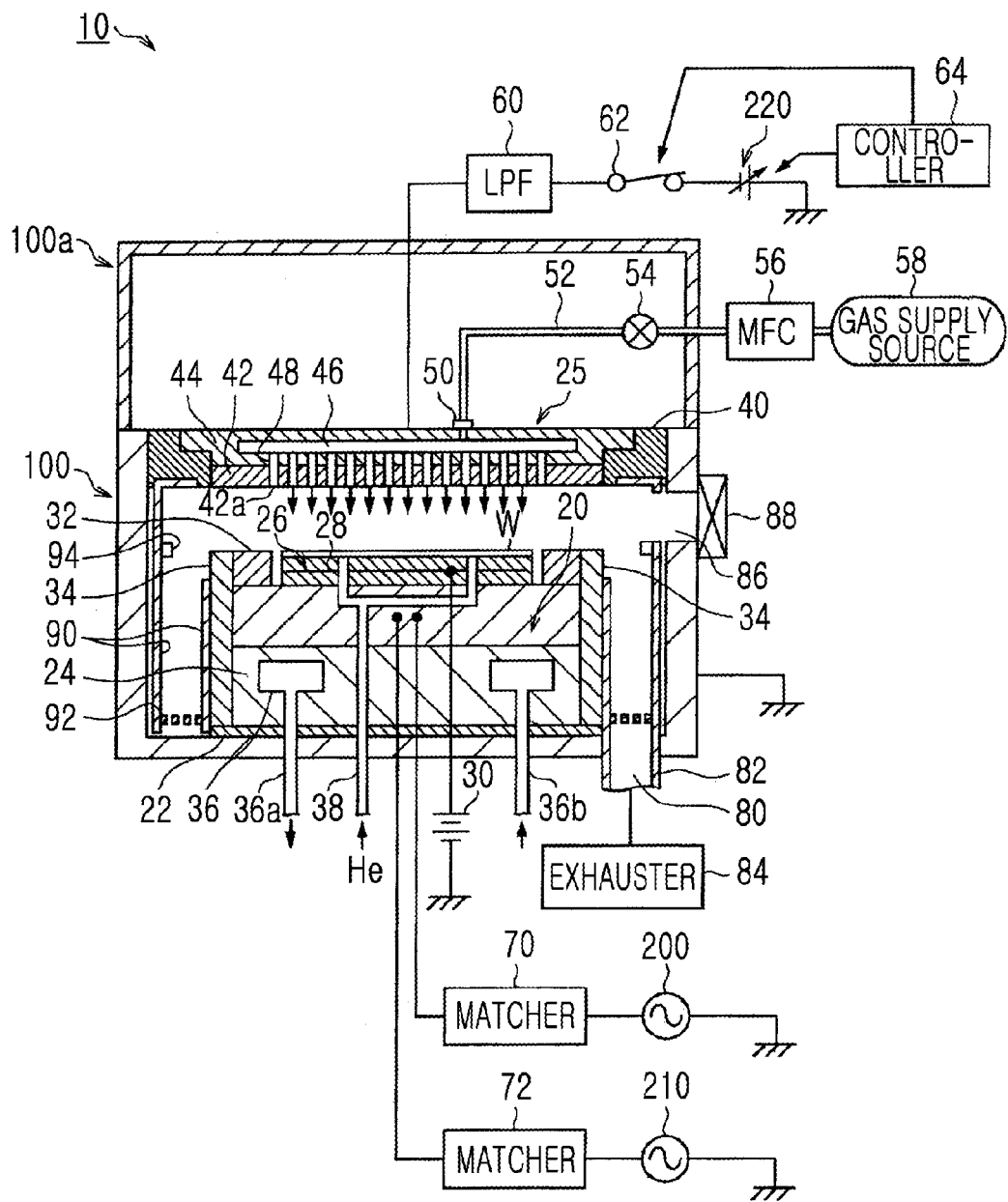
FIG. 2 is a cross-sectional view showing the plasma processing apparatus of FIG. 1 in detail.

First, an overall structure of a plasma processing apparatus capable of performing a plasma processing method according to first and second embodiments as will be described later will be described with reference to FIGS. 1 and 2. FIG. 1 is a schematic cross-sectional view of a plasma processing apparatus according to the first and second embodiments of the present invention. FIG. 2 is a cross-sectional view showing the plasma processing apparatus of FIG. 1 in detail.

A plasma processing apparatus 10 includes a chamber (a processing container 100) having an approximately cylindrical shape formed of, for example, aluminum whose surface is anodized. The processing container 100 is grounded. The plasma processing apparatus 10 is a capacity coupled parallel plate plasma etching apparatus in which a susceptor 20 constituting a lower electrode and an upper electrode 25 face each other inside the processing container 100 and RF2 frequency is applied through a lower part of the processing container 100. In the plasma processing apparatus 10, a frequency of 27 MHz or above for generating plasma, for example, high frequency (RF) power of 40 MHz, is applied to the susceptor 20 from a first high frequency power source 200, while a frequency of 13.56 MHz or lower for dragging ions (for bias), for example, high frequency power of 2 MHz, is applied to the susceptor 20 from a second high frequency power source 210. Also, in the plasma processing apparatus 10, a predetermined direct current (DC) voltage is applied to the upper electrode 25 from a variable direct current power source 220 connected to the upper electrode 25.

The plasma processing apparatus 10 will be described in detail with reference to FIG. 2. A susceptor support 24 having a cylindrical shape is provided at a lower part of the processing container 100 by disposing an insulating plate 22 formed of ceramic or the like between the susceptor support 24 and the lower part of the processing container 100, and the susceptor 20 formed of, for example, aluminum, is provided on the susceptor support 24. As described above, the susceptor 20 is the lower electrode, and a semiconductor wafer W constituting a substrate to be processed is placed on the susceptor 20.

An electrostatic chuck 26 that adsorbs and holds the semiconductor wafer W with an electrostatic force is provided on a top surface of the susceptor 20. The electrostatic chuck 26 has a structure in which an electrode 28 formed of a conductive film is inserted between a pair of insulating layers or insulating sheets, where the electrode 28 is electrically connected to a direct current power source 30, and the semiconductor wafer W is adsorbed and held by the electrostatic chuck 26 with an electrostatic force such as Coulomb force or the like generated by a direct current voltage from the direct current power source 30.

A conductive focus ring 32 formed of, for example, silicon, for improving uniformity of etching is provided around the semiconductor wafer W and on the top surface of the susceptor 20. An inner wall member 34 having a cylindrical shape and formed of, for example, quartz, is provided on side surfaces of the susceptor 20 and susceptor support 24.

Refrigerant chambers 36 are provided inside, for example, on a circumference of the susceptor support 24, and a refrigerant at a predetermined temperature is supplied to and circulates in the refrigerant chambers 36 from a chiller unit (not shown) provided outside the plasma processing apparatus 10 through pipes 36a and 36b, thereby controlling a process temperature of the semiconductor wafer W on the susceptor. A heat transferring gas, for example, a He gas, is supplied between a top surface of the electrostatic chuck 26 and a back surface of the semiconductor wafer W through a gas supply line 38.

A plasma excitation space is provided between the upper electrode 25 and the susceptor 20 constituting the lower electrode. The upper electrode 25 is supported at an upper portion of the processing container 100 via an insulating shielding member 40. The upper electrode 25 includes an electrode plate 42 having a plurality of gas ejection holes 42a, and an electrode support 44 that supports the electrode plate 42 to be freely attached and detached and is formed of a conductive material, for example, aluminum whose surface is anodized. The electrode plate 42 may be a conductor or semiconductor of low resistance that generates low Joule heat, and may be formed of silicon or SiC. A gas diffusing chamber 46 is provided inside the electrode support 44, and a plurality of gas through holes 48 communicating with the gas ejection holes 42a extend downward from the gas diffusing chamber 46. Accordingly, the upper electrode 25 operates as a shower head for supplying a desired gas.

A gas inlet 50 for introducing a process gas to the gas diffusing chamber 46 is provided in the electrode support 44. A gas supply pipe 52 is connected to the gas inlet 50. A gas supply source 58 is connected to the gas supply pipe 52 through an opening/shutting valve 54 and a mass flow controller (hereinafter, referred to as an MFC) 56.

In an etching process, a mixture gas including an F-based gas is supplied as an etching gas from the gas supply source 58, reaches the gas diffusing chamber 46 from the gas supply pipe 52, and is introduced to the plasma excitation space in a shower shape through the gas through holes 48 and the gas ejection holes 42a.

In a modifying process of a resist film performed before the etching process, for example, a $CF_4$ gas, a COS gas, and an argon gas are supplied as a modifying gas from the gas supply source 58. Here, the argon gas included in the modifying gas is an example, and another gas may be used as long as it is an inert gas.

The upper electrode 25 is electrically connected to the variable direct current power source 220 through a low pass filter (hereinafter, referred to as LPF) 60. The variable direct current power source 220 may be a bipolar power source. Power feed by the variable direct current power source 220 can be turned on and off by using an on/off switch 62. A polarity, a current, and a voltage of the variable direct current power source 220, and on and off of the on/off switch 62 are controlled by a controller 64. The LPF 60 is used to trap high frequencies from first and second high frequency power sources that will be described later, and may suitably include an LR filter or LC filter.

A grounding conductor 100a having a cylindrical shape is provided from the side wall of the processing container 100 to extend upward higher than a height of the upper electrode 25. The cylindrical grounding conductor 100a has a ceiling wall at the upper portion.

The susceptor 20 is electrically connected to the first high frequency power source 200 for outputting high frequency power for plasma excitation, through a matcher 70. Also, the susceptor 20 is connected to the second high frequency power source 210 for outputting high frequency power for bias, through a matcher 72.

The matchers 70 and 72 are respectively used to match load impedance to internal (or output) impedance of the first and second high frequency power sources 200 and 210, and operate to externally match the internal impedance of the first and second high frequency power sources 200 and 210 and the load impedance when plasma is generated inside the processing container 100.

An exhaust port 80 is provided at the lower part of the processing container 100, and an exhauster 84 is connected to the exhaust port 80 through an exhaust pipe 82. The exhauster 84 includes a vacuum pump, such as a turbo molecular pump or the like, and is capable of depressurizing an inside of the processing container 100 to a desired vacuum level.

A transfer from/to hole 86 of the semiconductor wafer W is provided on the side wall of the processing container 100, and the transfer from/to hole 86 is capable of being opened and shut by a gate valve 88. Also, a deposit shield 90 is provided along an inner wall of the processing container 100 to be freely attachable and detachable to and from the processing container 100 so as to prevent an etching byproduct (a deposit) from being attached to the processing container 100. In other words, the deposit shield 90 is a chamber wall. Also, the deposit shield 90 is also provided on an outer circumference of the inner wall member 34. An exhaust plate 92 is provided between the deposit shield 90 at a side of the chamber wall in the lower part of the processing container 100 and the deposit shield 90 at a side of the inner wall member 34. The deposit shield 90 and the exhaust plate 92 may be suitably formed of an aluminum material coated with ceramic, such as $Y_2O_3$ or the like. A conductive member (GND block) 94 direct-currently connected to the ground is provided on a portion forming a chamber inner wall of the deposit shield 90 at a height almost identical to that of the semiconductor wafer W, thereby preventing an abnormal discharge.

The controller 64 executes a plasma process in the plasma processing apparatus 10 according to a recipe constituting a control program for realizing various processes performed in the plasma processing apparatus 10 or a program for executing a process in each element of the plasma processing apparatus 10 according to a process condition. The recipe may be stored in a hard disk (not shown) or a semiconductor memory (not shown), or accommodated in a portable type recording medium, such as a CD-ROM, a DVD, or the like capable of being read by computer.

In order to perform a modifying process and an etching process in the plasma processing apparatus 10 having such a structure, the gate valve 88 is opened first, and the semiconductor wafer W as an etching target is transferred into the processing container 100 through the transfer from/to hole 86 and placed on the susceptor 20. Also, a modifying gas or etching gas is introduced from the gas supply source 58 to the gas diffusing chamber 46 at a predetermined flow rate and is introduced into the processing chamber 100 through the gas through holes 48 and the gas ejection holes 42a while evacuating the inside of the processing container 100 by using the exhauster 84, and a pressure inside the processing container is controlled to a setting value of a recipe.

While the modifying gas or etching gas is introduced in the processing container 100, high frequency power for plasma excitation is applied from the first high frequency power source 200 to the susceptor 20. Also, high frequency power for dragging ions is suitably applied from the second high frequency power source 210 to the susceptor 20. Also, a predetermined negative direct current voltage is applied from the variable direct current power source 220 to the upper electrode 25. Also, a direct current voltage is applied from the direct current power source 30 to the electrode 28 of the electrostatic chuck 26, and the semiconductor wafer W is fixed to the susceptor 20.

A gas ejected from the gas ejection holes 42a provided on the electrode plate 42 of the upper electrode 25 is plasmatized in a glow discharge generated by high frequency power between the upper electrode 25 and the lower electrode (susceptor 20), and a face to be processed of the semiconductor wafer W is modified or etched by radicals or ions generated from the plasma.

Here, the susceptor 20 constituting the lower electrode corresponds to a first electrode provided in a plasma processing apparatus to generate plasma. In an etching process, high frequency power for plasma excitation is applied to the first electrode to excite plasma from an etching gas. Also, the upper electrode 25 corresponds to a second electrode provided in the plasma processing apparatus. In a modifying process, high frequency power is applied to the first electrode to excite plasma from a modifying gas while a negative direct current voltage is applied to the second electrode provided in the plasma processing apparatus.

<First Embodiment>

Next, a plasma processing method according to the first embodiment of the present invention, performed in the plasma processing apparatus 10 described above, will be described. The plasma processing method according to the first embodiment is applicable to etching of a Si-ARC film using an ArF resist film as a mask. FIG. 3 is cross sectional views of a deposited film for explaining a modifying method of a resist film and an etching method of a layer to be etched, according to the present embodiment.

(Patterning)

Figure 3A:
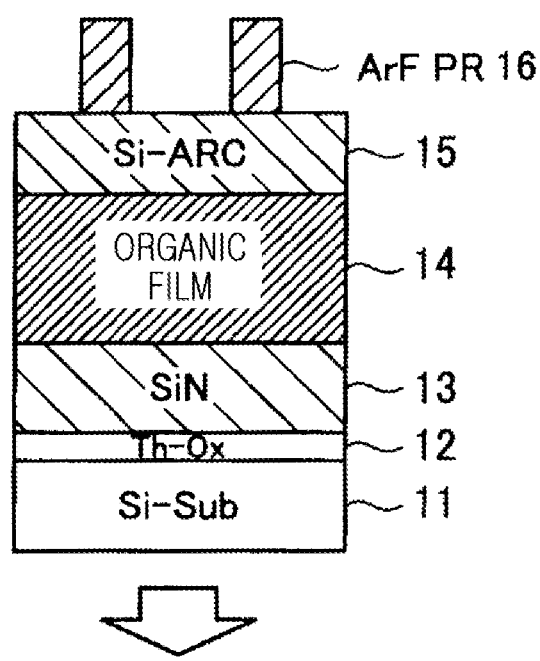
FIGS. 3A through 3F are views for explaining a hardening process and an etching process according to the first embodiment of the present invention.

As shown in FIG. 3A, a single thermal oxidation film (Th-Ox) 12 and a silicon nitride film (hereinafter, referred to as a SiN film) 13 are formed on a silicon containing substrate (Si-Sub) 11 of the semiconductor wafer W. An organic film 14 constituting a layer to be etched is formed directly on the SiN film 13, and a silicon containing inorganic reflection film (hereinafter, referred to as a Si-ARC film) 15 is formed on the organic film 14. The Si-ARC film 15 is used to prevent reflection during an exposure process of a photosensitive film. Also, the organic film 14 and the SiN film 13 are examples of a layer to be etched, and the layer to be etched is not limited thereto and may be, for example, an insulating film or a conductive film. The layer to be etched may be the silicon substrate (Si-Sub) 11.

An ArF resist film (ArF PR) 16 is formed on the Si-ARC film 15. The ArF resist film 16 is formed by using ArF lithography on the Si-ARC film 15. In detail, a photosensitizer is coated on the Si-ARC film 15, and the Si-ARC film 15 is exposed by irradiating an ArF laser beam having a wavelength of 193 nm through a shading material called a mask on which a pattern to be burned in is formed. After the exposure, an exposed portion is chemically corroded (etched) so as to form a desired pattern on the ArF resist film 16. As such, a minute circuit may be obtained by reducing a wavelength by using ArF lithography that uses an ArF laser as an exposure light source.

(Hardening: Modifying Process)

Figure 3B:
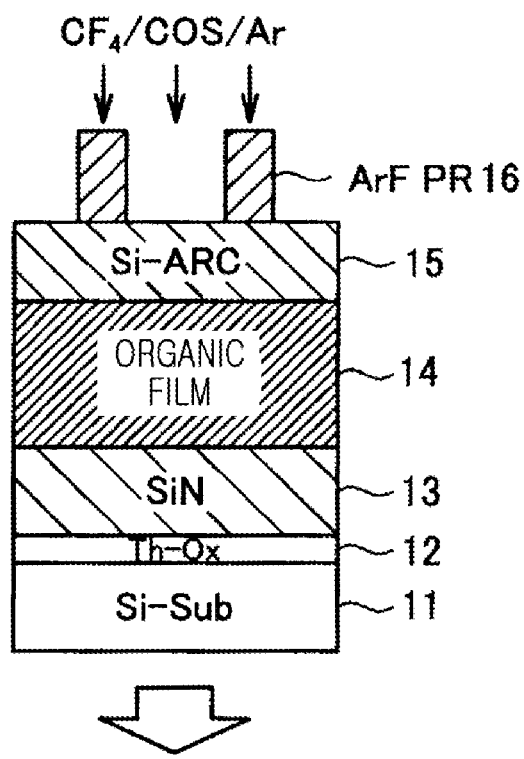

In hardening (modifying process) of FIG. 3B, the ArF resist film 16 is modified and hardened by using a modifying gas including a carbonyl sulfide gas (a COS gas). In detail, a hardening process is performed before an etching process, where a modifying gas including a tetrafluoromethane ($CF_4$) gas, a carbonyl sulfide gas (a COS gas) and an argon (Ar) gas is introduced into a plasma processing apparatus, and the ArF resist film 16 is modified by plasma excited from the modifying gas.

Since the ArF resist film 16 has low plasma resistance, a hardening process of increasing etch resistance of the ArF resist film 16 has been conventionally suggested as a pre-process of a process of etching an anti reflection coating film by using the ArF resist film 16 as a mask, where a gas including an $H_2$ gas is plasmatized and the ArF resist film 16 is processed by plasma, thereby injecting $H^+$ ions into the ArF resist film 16.

However, when the $H_2$ gas is used during the hardening process of the ArF resist film 16, silicon is deposited in an open area (a large hole or the like) inside a processing container and becomes a residue. The deposited residue adversely affects an etching process afterward.

Based on experiments and studies of the inventors, it was determined that a residue is not generated and a reduction amount of the ArF resist film 16 is lower when the ArF resist film 16 is processed by plasma based on a modifying gas using a COS gas as a base, than when the ArF resist film 16 is processed by plasma based on a modifying gas using an $H_2$ gas as a base. This is because a surface of the ArF resist film 16 has been modified to CS by a chemical reaction of $COS+CF_4 \rightarrow CO+SOx+SFx+CS$ during the hardening process.

Also, during the hardening step, a negative direct current voltage (DCS) outputted from the variable direct current power source 220 is applied to the upper electrode 25 provided in the processing container 100, thereby thickening a modified film formed on the surface of the ArF resist film 16 compared to when the negative direct current voltage is not applied. As a result, it was determined that both a residual film and an LWR of the ArF resist film 16 may be improved. Also, a critical dimension (hereinafter, referred to as a CD) was maintained at a suitable value. The modifying of the ArF resist film 16 by introducing the COS gas and applying the direct current voltage will be described in more detail later. Also, in process conditions that will be described later, a direct current voltage supplied from the variable direct current power source 220 is shown as an absolute value, but actually, a negative value is applied.

(Etching Process of Si-ARC Film)

Figure 3C:
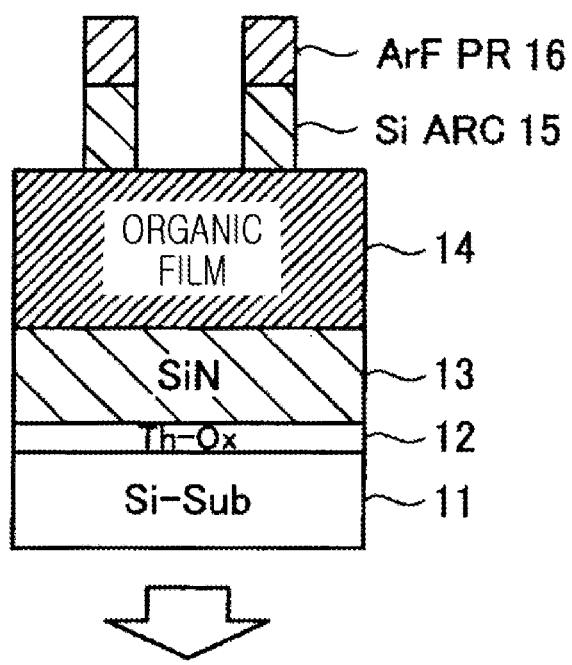

In an etching process of the Si-ARC film 15 in FIG. 3C, the Si-ARC film 15 is etched by using a mixture gas including a tetrafluoromethane ($CF_4$) gas and an oxygen ($O_2$) gas as an etching gas. Here, the ArF resist film 16 operates as a mask. As a result of etching, a pattern of the ArF resist film 16 is transferred to the Si-ARC film 15.

(Etching Process of Organic Film)

Figure 3D:
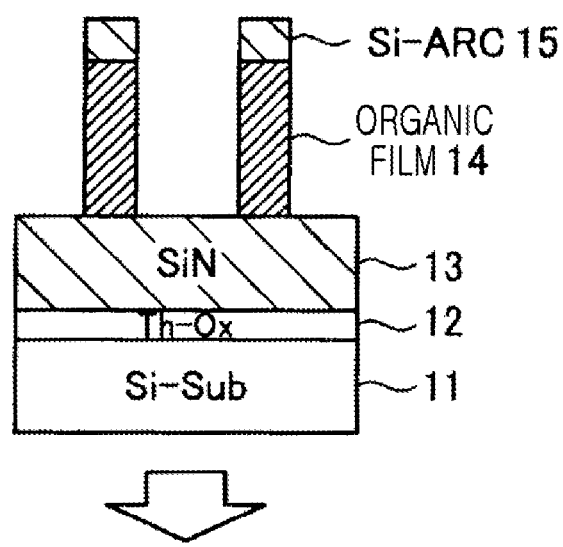

In an etching process of the organic film 14 in FIG. 3D, the organic film 14 is etched by using a mixture gas including a carbonyl sulfide gas (a COS gas) and an oxygen ($O_2$) gas as an etching gas. Here, the Si-ARC film 15 operates as a mask. As a result of etching, a pattern of the Si-ARC film 15 is transferred to the organic film 14.

(Etching Process of SiN Film)

Figure 3E:
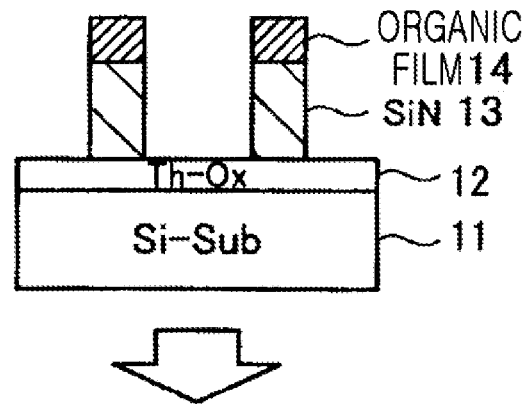

In an etching process of the SiN film 13 in FIG. 3E, the SiN film 13 is etched by using a mixture gas including a tetrafluoromethane ($CF_4$) gas, a trifluoromethane ($CHF_3$) gas, an oxygen ($O_2$) gas, and an argon (Ar) gas as an etching gas. Here, the organic film 14 operates as a mask. As a result of etching, a pattern of the organic film 14 is transferred to the SiN film 13.

(Ashing Process of Organic Film)

Figure 3F:
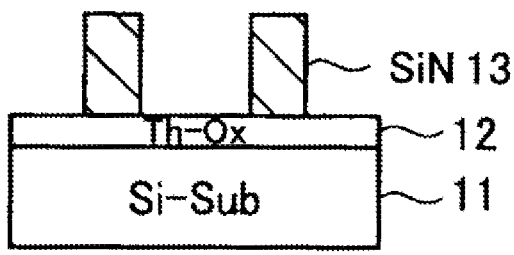

In an ashing process of the organic film 14 in FIG. 3F, the organic film 14 is ashed by using an oxygen ($O_2$) gas as an ashing gas. As a result of ashing, the SiN film 13 minutely processed to a desired pattern is formed on the silicon containing substrate (Si-Sub) 11 of the semiconductor wafer W.

(Modification of ArF Resist Film by Introducing COS Gas and Applying Direct Current Voltage)

Next, modification of the ArF resist film 16 by introducing a COS gas and applying a direct current voltage will be described in detail based on results of experiments performed by the inventors.

The inventors proved via experiments that an etching rate (hereinafter, referred to as an ER) and a critical dimension (hereinafter, referred to as a CD) of the ArF resist film 16 can be improved by hardening the ArF resist film 16 by using a mixture gas including a $CF_4$ gas, a COS gas and an Ar gas. The results are shown in FIGS. 4A and 4B.

FIG. 4A shows an etching rate (an ER) of the ArF resist film 16. A pair of bar graphs at the left end shown in (1) are the ERs of the ArF resist film 16 when the ArF resist film 16 is not modified by a COS gas (initial). A pair of bar graphs at the center shown in (2) are the ERs of the ArF resist film 16 when the ArF resist film 16 is modified by a COS gas and a direct current voltage (DCS) of 300 V is applied to the ArF resist film 16. A pair of bar graphs at the right end shown in (3) are the ERs of the ArF resist film 16 when the ArF resist film 16 is modified by a COS gas and a direct current voltage (DCS) of 900 V is applied to the ArF resist film 16. A left bar graph of each of the pair of bar graphs is an etching rate of a center portion of the ArF resist film 16, and a right bar graph of each of the pair of bar graphs is an etching rate of an end portion of the ArF resist film 16. 3 process conditions of (1) through (3) will now be described in detail.

Etching Condition of ArF Resist Film 16 in (1):

Etching Gas Type $CF_4/CHF_3$

In (1), hardening is not performed before an etching process.

Hardening Condition of ArF Resist Film 16 in (2):

Direct Current Voltage 300 V and Modifying Gas Types and Flow Rates $COS/CF_4/Ar=20/40/800$ sccm In (2), the ArF resist film 16 is modified under the hardening condition, and then is etched under the same etching condition as (1).

Hardening Condition of ArF Resist Film 16 in (3):

Direct Current Voltage 900 V and Modifying Gas Types and Flow Rates $COS/CF_4/Ar=20/40/800$ sccm In (3), the ArF resist film 16 is modified under the hardening condition, and then is etched under the same etching condition as (1). A difference between the hardening conditions of (2) and (3) is only a value of a direct current voltage.

(Etching Rate ER)

Referring to the results of FIG. 4A, the etching rate of the ArF resist film 16 is lowered and plasma resistance of the ArF resist film 16 is improved in (2) and (3) in which the ArF resist film 16 is modified by using the COS gas compared to in (1) in which the modifying is not performed. Also, the etching rate of the ArF resist film 16 is more lowered and the plasma resistance is improved in the modifying of (3) in which the direct current voltage 900 V is applied compared to the modifying of (2) in which the direct current voltage 300 V is applied.

During plasma excitation, electrons are mainly generated around the upper electrode 25 of a plasma generating space. When the direct current voltage is applied to the upper electrode 25 from the variable direct current power source 220 in such a situation during the modifying process, the electrons are accelerated in a perpendicular direction of the plasma excitation space by a potential difference between the value of the applied direct current voltage and plasma potential. Here, a desired polarity, a desired voltage value, and a desired current value of the variable direct current power source 220 are set so as to irradiate the electrons on the semiconductor wafer W. The irradiated electrons effectively modifies composition of the ArF resist film 16 by the COS gas. Accordingly, the modifying of the ArF resist film 16 is reinforced by applying the direct current voltage. In other words, in the present embodiment, the applied voltage value of the variable direct current power source 220 varies (300 V and 900 V) to control an amount of electrons generated near the upper electrode 25 by the applied voltage value, and an acceleration voltage of the electrons to the semiconductor wafer W, thereby improving plasma resistance of the ArF resist film 16. Accordingly, etching selectivity of the layer to be etched can be improved.

(CD Value)

Next, a critical dimension (hereinafter, referred to as a CD) will be mentioned as a modifying effect. In the hardening condition of the ArF resist film 16 in FIG. 4B, the direct current voltage was 300 V and modifying gas types and flow rates were $H_2$ or $COS/CF_4/Ar=100$ or $20/40/800$ sccm.

Referring to the results of FIG. 4B, a CD value was 49.85 before modifying the ArF resist film 16 (initial). In this regard, a CD value was 53.72 when an $H_2$ gas is used as a modifying gas and a flow rate of the $H_2$ gas is 100 sccm. Meanwhile, a CD value was 51.72 when a COS gas is used as a modifying gas according to the present embodiment and a flow rate of the COS gas is 20 sccm. Based on the results, since the CD value can be maintained to a suitable value when the ArF resist film 16 is modified by a plasma process using the COS gas according to the present embodiment, more precise minute processing is possible.

(LWR)

Figure 5:
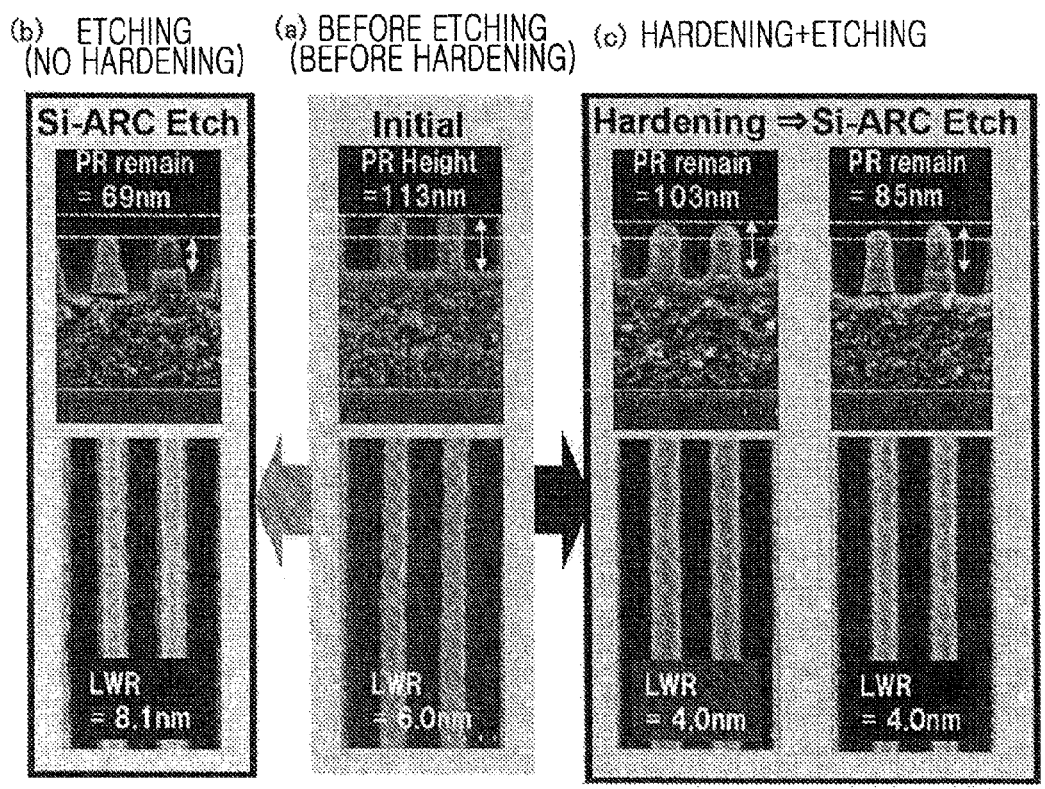
FIG. 5 is view for explaining an effect of the hardening process of the first embodiment.

Next, line width roughness (hereinafter, referred to as LWR) will be mentioned as a modifying effect. FIG. 5 is view showing residual films and LW Rs of the ArF resist film 16 after etching, when the ArF resist film 16 is hardened and not hardened.

Hardening Condition of ArF Resist Film 16 in FIG. 5:

Direct Current Voltage 900 V and Modifying Gas Types and Flow Rates $COS/CF_4/Ar=20/40/800$ sccm Etching Gas Types $CF_4/O_2$ of ArF Resist Film 16 in FIG. 5

(a) of FIG. 5 is a view showing a state of the ArF resist film 16 (initial) before etching (before hardening). A height and LWR of the ArF resist film 16 in this state are respectively 113 nm and 6.0 nm.

In this regard, (b) of FIG. 5 is a view showing a state of the ArF resist film 16 after etching the Si-ARC film 15, without hardening the ArF resist film 16. A height and LWR of a residual film of the ArF resist film 16 in this state are respectively 69 nm and 8.1 nm.

Meanwhile, (c) of FIG. 5 is a view showing a state of the ArF resist film 16 after etching the Si-ARC film 15, after hardening and modifying the ArF resist film 16. A height and LWR of the ArF resist film 16 in this state after hardening are respectively 103 nm and 4.0 nm. Also, a height and LWR of a residual film of the modified ArF resist film 16 are respectively 85 nm and 4.0 nm after etching the Si-ARC film 15.

As described above, it was determined that the residual film of the ArF resist film 16 increases and a value of the LWR decreases by performing an etching process after the ArF resist film 16 is modified based on the process conditions according to the present embodiment. Accordingly, a precise pattern can be formed on the layer to be etched during the etching process as a following process.

($COS/CF_4$ Gas Flow Rates: $CF_4$ Gas Fixation)

Figure 6:
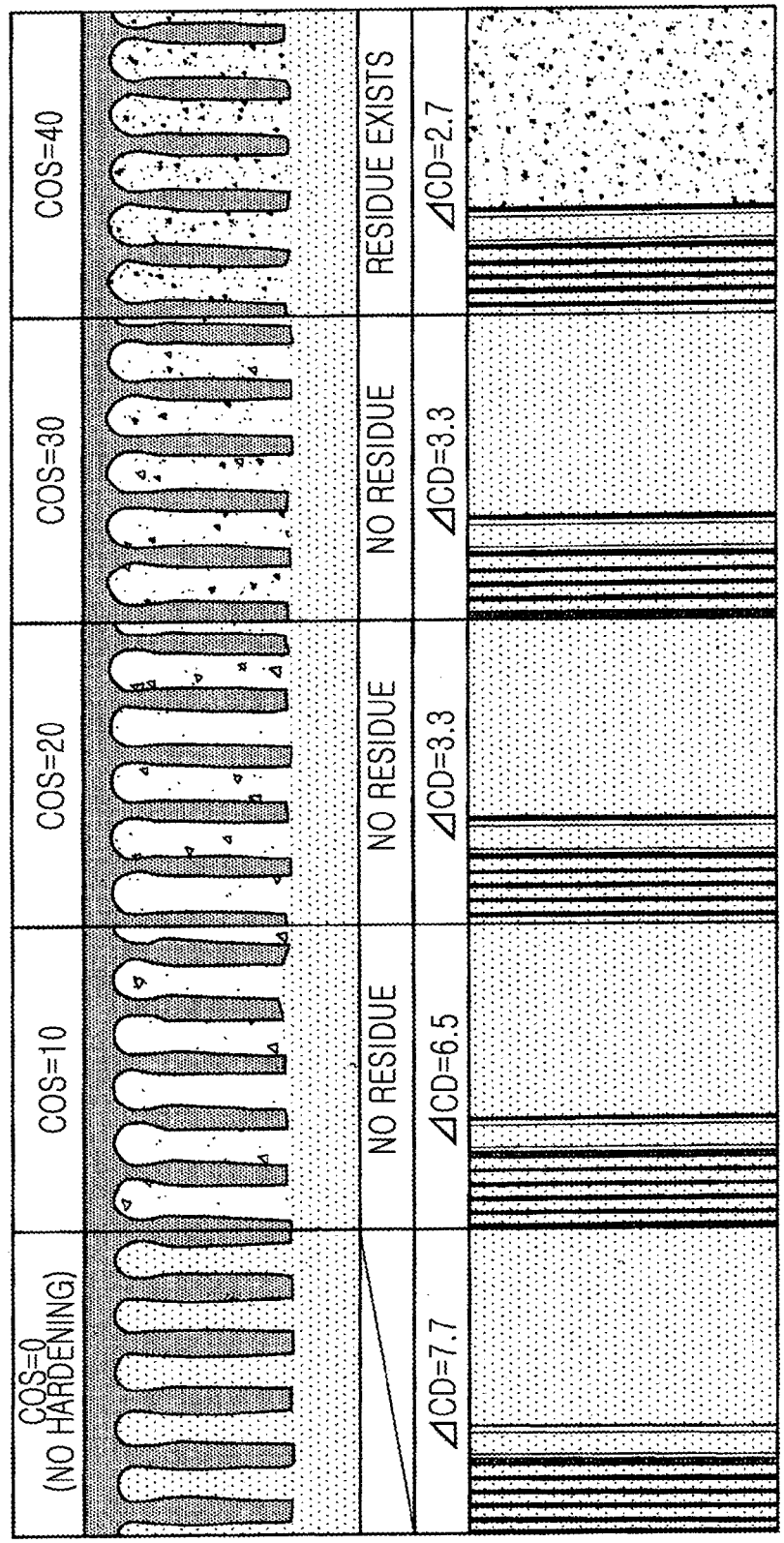
FIG. 6 is a view for explaining a control of a COS flow rate during the hardening process of the first embodiment.

Next, the inventors obtained flow rates of $COS/CF_4$ gas that most favorably modify an ArF resist film via experiments based on the ideas that an amount of F included in a modifying gas can be controlled by controlling flow rates (ratio) of a COS gas and a $CF_4$ gas. FIG. 6 shows pattern shapes after etching an organic film, as experiment results when flow rates of a $CF_4$ gas and Ar gas are respectively fixed at 40 sccm and 800 sccm, and a flow rate of a COS gas is changed by 10 sccm in the range from 0 to 40 sccm.

Hardening Condition of ArF Resist Film 16:

Direct Current Voltage 900 V and Modifying Gas Types and Flow Rates $COS/CF_4/Ar$=Variable (0, 10, 20, 30, and 40)/40/800 sccm Etching Gas Types $CF_4/CHF_3/O_2$ of Si-ARC Film 15

Etching Gas Types $O_2/COS$ of Organic Film 14

Considering the results of FIG. 6, a difference value of CDs before and after etching is high when a resist film was not modified by using a COS gas (COS=0 sccm: no hardening process). Meanwhile, a difference value of CDs is small when a resist film is modified by using a COS gas (COS=10, 20, 30, and 40 sccm), and thus a pattern shape is more formed compared to when a resist film is not modified by using a COS gas. However, when COS is 40 sccm, a residue is generated, thereby adversely affecting an etching process.

Based on the results of FIG. 6, the flow rate of the COS gas may be in the range from 10 to 30 sccm, when the flow rate of the $CF_4$ gas is 40 sccm. In other words, the ratio ($CF_4/COS$) of the flow rates of the $CF_4$ gas and the COS gas included in the modifying gas may be $4/3 \leq (CF_4/COS) \leq 4$.

($COS/CF_4$ Gas Flow Rates: COS Gas Fixation)

Next, the inventors obtained a modified state of the ArF resist film 16 via experiments when flow rates (ratio) are controlled by fixing a flow rate of a COS gas and varying a flow rate of a $CF_4$ gas.

A hardening condition and an etching condition are almost similar to those of the experiment of FIG. 6 where a flow rate of a $CF_4$ gas is fixed. As described above, in the present experiment, only a flow rate of a modifying gas is different from that of the experiment of FIG. 6, and thus $CF_4/COS/Ar$ are variable (40, 60, and 80)/20/800 sccm. Pattern shapes after etching an organic layer are shown in FIG. 7 as experiment results under this condition.

Figure 7:
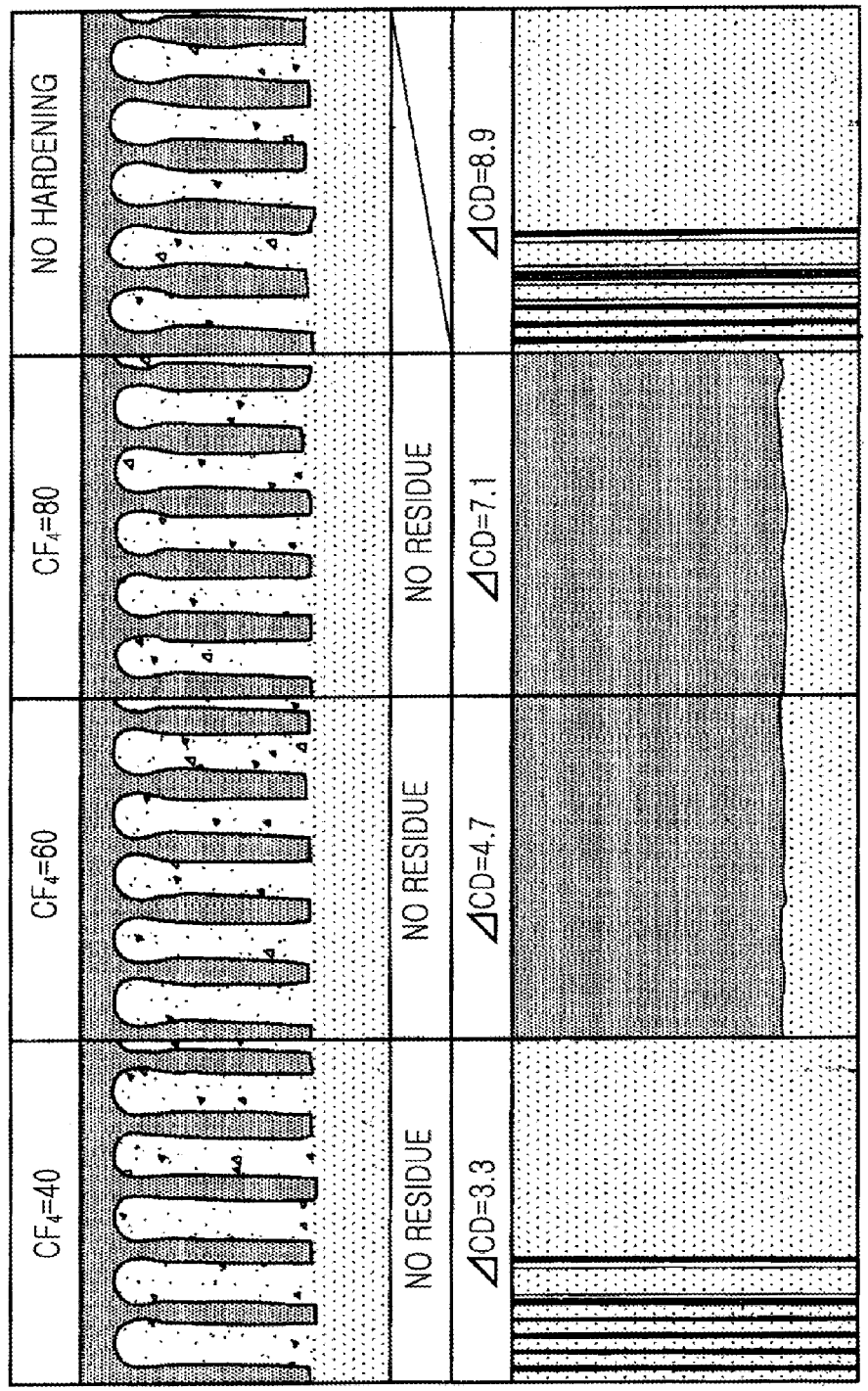
FIG. 7 is a view for explaining a control of a $CF_4$ flow rate during the hardening process of the first embodiment.

Considering results of FIG. 7, a difference value of CDs is high when a resist film is not modified (no hardening) by using a COS gas. When a resist film is modified by using a COS gas ($CF_4$=40 and 60 sccm), a difference value of CDs is lower than when there is no hardening, and a pattern shape is more formed compared to when a resist film is not modified. However, when $CF_4$ is 80 sccm, a difference value of CDs is not so small, and is close to when a resist film is not modified by a COS gas.

Based on the results of FIG. 7, when a flow rate of the COS gas is 20 sccm, a flow rate of the $CF_4$ gas may be in the range from 40 to 60 sccm. In other words, the ratio ($CF_4/COS$) of the flow rates of the $CF_4$ gas and the COS gas included in a modifying gas may be $2 \leq (CF_4/COS) \leq 3$.

Figure 8:
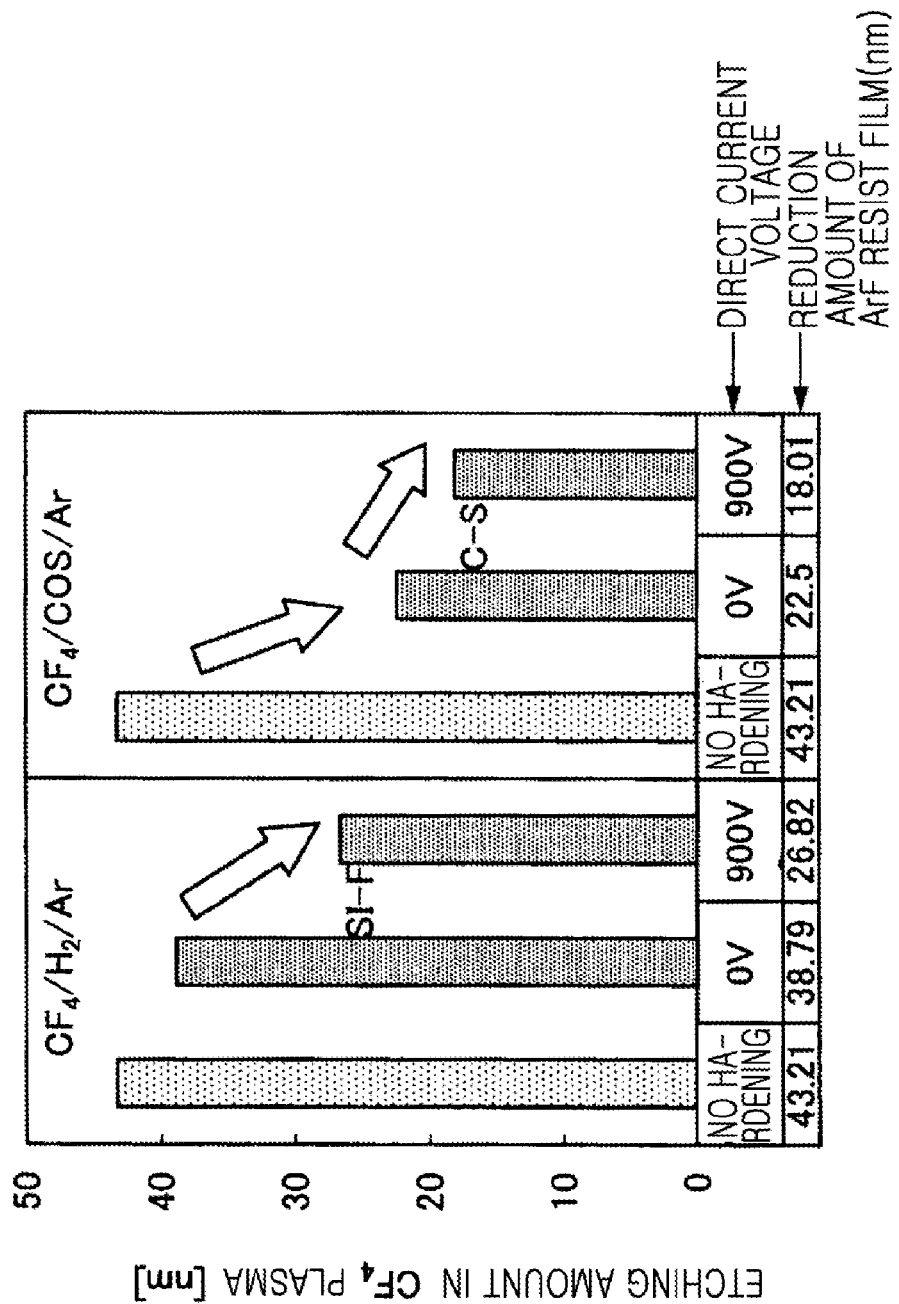
FIG. 8 is a view for explaining an effect of the hardening process of the first embodiment.

Also, during the modifying process, a thickness of a modified layer of a resist film may be increased by applying a direct current voltage to the upper electrode 25. This will be described with reference to FIG. 8. A left outline of FIG. 8 shows an etching amount using $CF_4$ gas plasma when a $CF_4$ gas, an $H_2$ gas, and an Ar gas are used as a modifying gas. A right outline of FIG. 8 shows an etching amount using $CF_4$ gas plasma when a $CF_4$ gas, a COS gas, and an Ar gas are used as a modifying gas, according to the present embodiment.

Bar graphs in each outline show, in an order from the left, a case when a layer to be etched is etched by using $CF_4$ gas plasma without performing a hardening process (modifying process), a case when a layer to be etched is etched by using $CF_4$ gas plasma after a hardening process (direct current voltage is not applied), and a case when a layer to be etched is etched by using $CF_4$ gas plasma after a hardening process (direct current voltage of 900 V is applied).

In FIG. 8, as a bar graph decreases, a reduction amount of an ArF resist film is decreased during an etching process. Accordingly, a reduction amount of an ArF resist film is lower when a layer to be etched is etched by using $CF_4$ gas plasma after performing a hardening process than when a layer to be etched is etched by using $CF_4$ gas plasma without performing a hardening process (modifying process). Also, a reduction amount of an ArF resist film is lower when a $CF_4$ gas, a COS gas and an Ar gas are used as a modifying gas than when a $CF_4$ gas, an $H_2$ gas and an Ar gas are used as a modifying gas. Also, a reduction amount of an ArF resist film is lower when a negative direct current voltage of 900 V is applied during the modifying process than when a direct current voltage is not applied during the modifying process.

Based on the above results and facts that a residue is difficult to be generated since a resist film is modified with CS when a $CF_4$ gas, a COS gas, and an Ar gas are used as a modifying gas but a silicon containing residue is easily generated since silicon is deposited when a $CF_4$ gas, an $H_2$ and an Ar gas are used as a modifying gas, it was determined that in the plasma processing method of the present embodiment, a modifying process of modifying the ArF resist film 16 with plasma generated from a modifying gas including a $CF_4$ gas, a COS gas and an Ar gas may be performed before an etching process of etching an anti reflection coating film of Si-ARC by using the ArF resist film 16 as a mask. Accordingly, since the surface of the ArF resist film 16 is modified and hardened, and a residual film of the ArF resist film 16 during etching may be increased, etching selectivity may be improved.

Also, a thickness of a modified layer of an ArF resist film may be increased by applying a negative direct current voltage during a modifying process. Accordingly, etching selectivity may be more improved.

Also, in the above experiments, the negative direct current voltage applied to the upper electrode 25 was −900 V. However, a thickness of a modified layer of a resist film may be increased when a negative direct current voltage is applied at least a little compared to when no negative direct current voltage is applied. Accordingly, the negative direct current voltage applied during the modifying process may be smaller than 0 V and equal to or above −900 V.

<Second Embodiment>

Next, a plasma processing method according to the second embodiment of the present invention will be described with reference to FIGS. 9A through 9F. The plasma processing method according to the second embodiment may be applicable to etching of a Si-ARC film using an EUV resist film 17 as a mask. FIGS. 9A through 9F are cross-sectional views of a deposited film for explaining a modifying method of a resist film and an etching method of a layer to be etched, according to the present embodiment.

(Patterning)

Figure 9A:
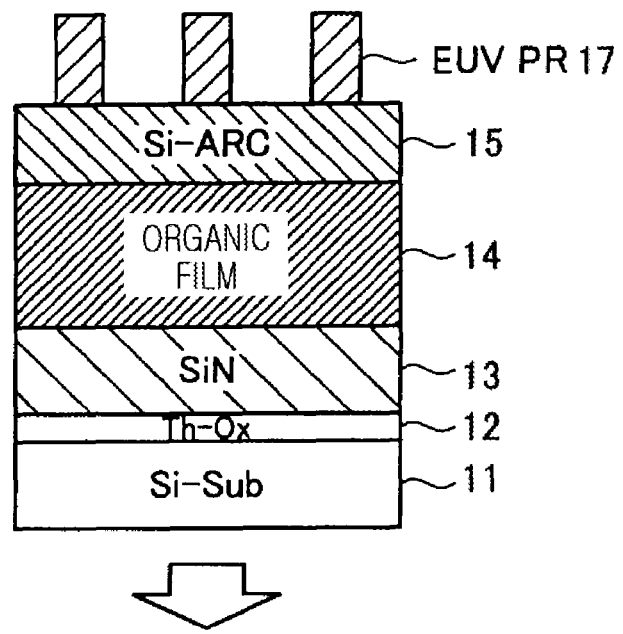
FIGS. 9A through 9F are views for explaining a hardening process and an etching process according to the second embodiment of the present invention.
Figure 9B:
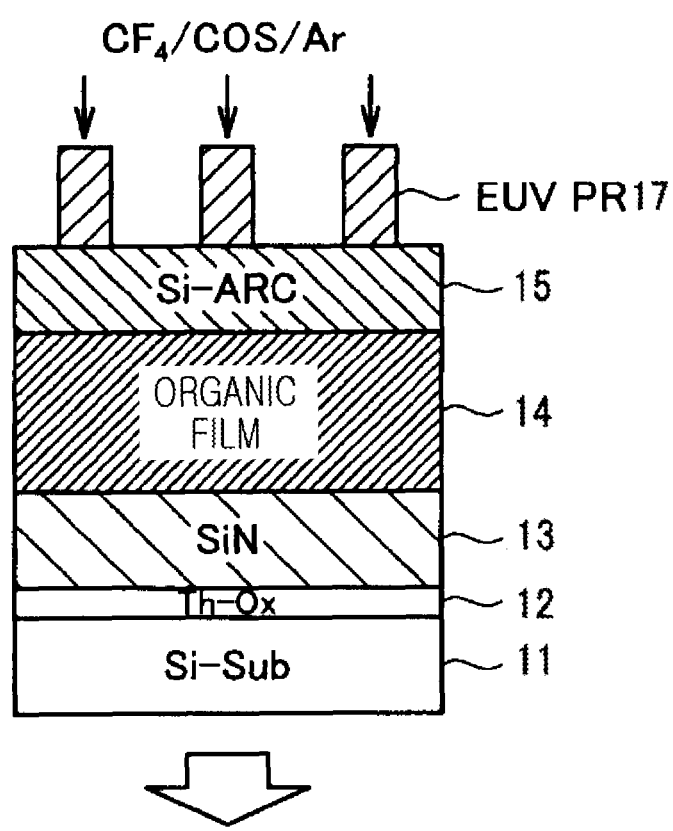
Figure 9C:
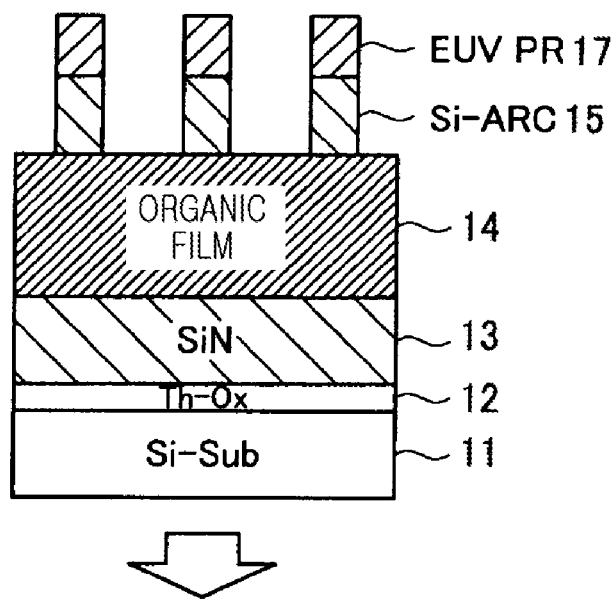
Figure 9D:
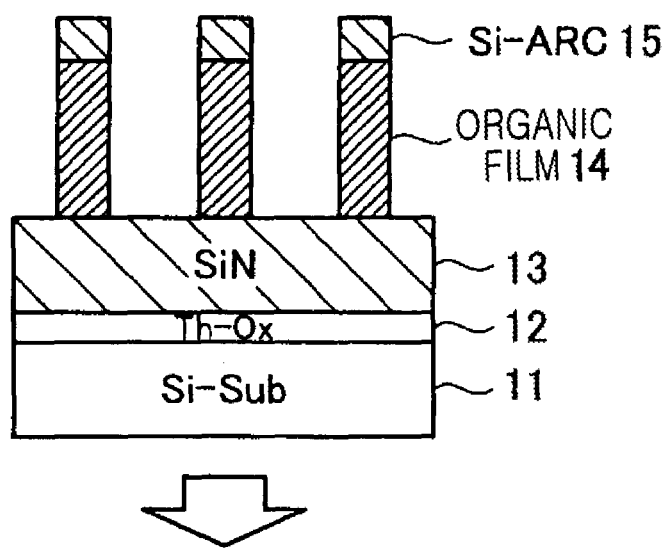
Figure 9E:
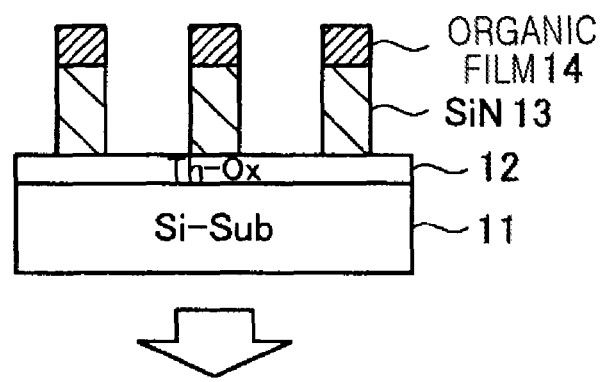
Figure 9F:
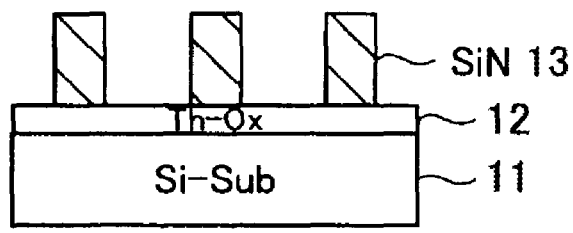

As shown in FIG. 9A, a single thermal oxidation film (hereinafter referred to as Th-Ox) 12 is formed on a silicon containing substrate (hereinafter, referred to as Si-Sub) 11 of a semiconductor wafer W. A silicon nitride film (hereinafter, referred to as an SiN film) 13 constituting a layer to be etched, and an organic film 14 are formed on the Th-Ox 12, and a silicon containing inorganic reflecting film (hereinafter, referred to as an Si-ARC film) 15 is formed on the organic film 14. The EUV resist film 17 (EUV PR) is formed on the Si-ARC film 15. The only difference from the layer to be etched of the first embodiment is a type of a resist film. Also, a hardening process and each etching process shown in FIGS. 9B through 9F are identical to a hardening process and each etching process according to the first embodiment. Thus, descriptions about each operation of FIGS. 9B through 9F are omitted herein.

(Modification of EUV Resist Film According to COS Gas and Application of Direct Current Voltage)

Next, modifying of the EUV resist film 17 according to a COS gas and application of a direct current voltage will be described in detail based on results of experiments performed by the inventors.

Hardening Condition of EUV Resist Film 17:

Direct Current Voltage 900 V and Modifying Gas Types and Flow Rates $CF_4/COS/Ar$=40/20/900 sccm Etching Gas Types $CF_4/O_2$ of Si-ARC Film 15

Etching Gas Types $O_2/COS$ of Organic Film 14

Etching Gas Types $CF_4/CHF_3/Ar/O_2$ of SiN Film 13

Ashing Gas Type $O_2$ of Organic Film 14

A top row of FIG. 10 shows side surface views of the deposited film of FIG. 9, and a bottom row of FIG. 10 shows top surface views of the deposited film. The columns of FIG. 10 are, in an order from the left, a view showing the EUV resist film 17 before etching (before hardening) (initial), a view showing the SiN film 13 after performing an etching process without hardening, a view showing the SiN film 13 after performing an etching process after hardening the SiN film 13 with a modifying gas including a $CF_4$ gas, a $H_2$ gas and an Ar gas, and a view showing the SiN film 13 after performing an etching process after hardening the SiN film 13 with a modifying gas including a $CF_4$ gas, a COS gas and an Ar gas.

A CD and LWR of the EUV resist film 17 (initial) are respectively 28.9 nm and 6.6 nm before etching (before hardening) in the leftmost view.

In this regard, a CD and LWR of the SiN film 13 are respectively 19.6 nm and 5.8 nm after performing an etching process without performing a hardening process. A CD and LWR of the SiN film 13 are respectively 25.4 nm and 4.0 nm after performing a hardening process with a modifying gas including a $CF_4$ gas, a $H_2$ gas and an Ar gas, and an etching process. A CD and LWR of the SiN film 13 are respectively 30.7 nm and 3.9 nm after performing a hardening process with a modifying gas including a $CF_4$ gas, a COS gas and an Ar gas, and an etching process.

According to the above, when an etching process is performed after the EUV resist film 17 is modified based on the modifying gas including a $CF_4$ gas, a COS gas and an Ar gas according to the present embodiment, a CD value of the SiN film 13 may maintain a most suitable value and have a small LWR value. Accordingly, a precise pattern may be formed on a layer to be etched during an etching process as a following process.

As described above, according to the present invention, a precise pattern can be formed on a layer to be etched by performing a process of modifying a resist film before an etching process of an anti reflection coating film using the resist film as a mask.

While this invention has been particularly shown and described with reference to exemplary embodiments thereof, it will be understood by those skilled in the art that various changes in form and details may be made therein without departing from the spirit and scope of the invention as defined by the appended claims.

For example, a resist film according to the present invention is not limited to one of a resist film for ArF exposure and a resist film for EUV exposure, and may be another resist film. Also, an anti reflection coating film according to the present invention is not limited to an Si-ARC film, but may be a silicon containing anti reflection coating film.

An etching processing apparatus according to the present invention is not limited to a parallel plate type plasma processing apparatus as long as it is a plasma processing apparatus, and may be another plasma processing apparatus, such as an inductively coupled plasma (ICP) processing apparatus, or the like.

What is claimed is:

1. A plasma processing method comprising:
    etching an anti reflection coating film with plasma generated from an etching gas by using a resist film that is patterned as a mask, in a deposited film in which the anti reflection coating film is formed on a layer to be etched and the resist film is formed on the anti reflection coating film; and
    hardening the resist film with plasma generated from a modifying gas comprising a $CF_4$ gas, a COS gas and an inert gas by introducing the modifying gas into a plasma processing apparatus, wherein the hardening is performed before the etching.

2. The plasma processing method of claim 1, wherein the etching comprises applying high frequency power to a first electrode provided inside the plasma processing apparatus so as to generate the plasma from the etching gas, and
    the hardening comprises applying a negative direct current voltage to a second electrode provided inside the plasma processing apparatus while applying the high frequency power to the first electrode provided inside the plasma processing apparatus so as to generate the plasma from the modifying gas.

3. The plasma processing method of claim 2, wherein the plasma processing apparatus comprises:
    a processing container;
    a lower electrode as the first electrode, which is provided inside the processing container and operates as a holding stage of a substrate on which the deposited film is deposited; and
    an upper electrode as the second electrode, which is provided inside the processing container and disposed to face the lower electrode.

4. The plasma processing method of claim 2, wherein a value of the negative direct current voltage applied to the second electrode is smaller than 0 V and equal to or above −900 V.

5. The plasma processing method of claim 1, wherein a ratio ($CF_4$/COS) of flow rates of the $CF_4$ gas and the COS gas included in the modifying gas is $4/3 \leq (CF_4/COS) \leq 4$.

6. The plasma processing method of claim 5, wherein the ratio ($CF_4$/COS) of the flow rates of the $CF_4$ gas and the COS gas included in the modifying gas is $2 \leq (CF_4/COS) \leq 3$.

7. The plasma processing method of claim 1, wherein the resist film is any one of a resist film for ArF exposure and a resist film for EUV exposure.

8. The plasma processing method of claim 1, wherein the inert gas included in the modifying gas is an argon gas.

9. The plasma processing method of claim 1, wherein the anti reflection coating film contains silicon.

* * * * *